United States Patent
Lim et al.

(10) Patent No.: US 6,828,185 B2
(45) Date of Patent: Dec. 7, 2004

(54) CMOS OF SEMICONDUCTOR DEVICE AND METHOD FOR MANUFACTURING THE SAME

(75) Inventors: Kwan Yong Lim, Kyoungki-do (KR); Heung Jae Cho, Kyoungki-do (KR); Dae Gyu Park, Kyoungki-do (KR); In Seok Yeo, Seoul (KR)

(73) Assignee: Hynix Semiconductor Inc., Ichon (KR)

( * ) Notice: Subject to any disclaimer, the term of this patent is extended or adjusted under 35 U.S.C. 154(b) by 20 days.

(21) Appl. No.: 10/230,345

(22) Filed: Aug. 29, 2002

(65) Prior Publication Data

US 2003/0082863 A1 May 1, 2003

(30) Foreign Application Priority Data

Nov. 1, 2001 (KR) ........................................ 2001-67849

(51) Int. Cl.[7] .......................................... H01L 21/8238
(52) U.S. Cl. ..................................................... 438/216
(58) Field of Search ................................. 438/199, 216; 257/368–369, 392, 410

(56) References Cited

U.S. PATENT DOCUMENTS 5,981,324 A * 11/1999 Seo et al. ................... 438/210
6,027,961 A * 2/2000 Maiti et al. ................. 438/199
6,538,278 B1 * 3/2003 Chau .......................... 257/324

* cited by examiner

Primary Examiner—Evan Pert
(74) Attorney, Agent, or Firm—Pillsbury Winthrop LLP

(57) ABSTRACT

The present invention discloses the single gate CMOS with the surface channel manufactured according to the manufacturing method of the present invention is very advantageous for improving the characteristics, yield and reliability of the device, by performing decoupled plasma nitridation (DPN) process on the gate oxide film of the cell NMOS and the peripheral PMOS, respectively, thereby forming a silicon nitride on the surface of the gate oxide film. Further, the single gate CMOS with the surface channel can be formed more easily through the simplified process in overall, without requiring a separate transient ion implantation process, even when the gate electrode of the n[+] polysilicon layer is used, by having the threshold voltage of the cell NMOS be approximately +0.9V, the threshold voltage of the peripheral PMOS be approximately −0.5V and above, and the threshold voltage of the peripheral NMOS be approximately +0.5V and below. In addition, since the cell NMOS already has +0.9V of threshold voltage, back bias does not have to be applied separately to achieve the +0.9V threshold voltage, and the device with low power consumption is formed successfully.

13 Claims, 19 Drawing Sheets

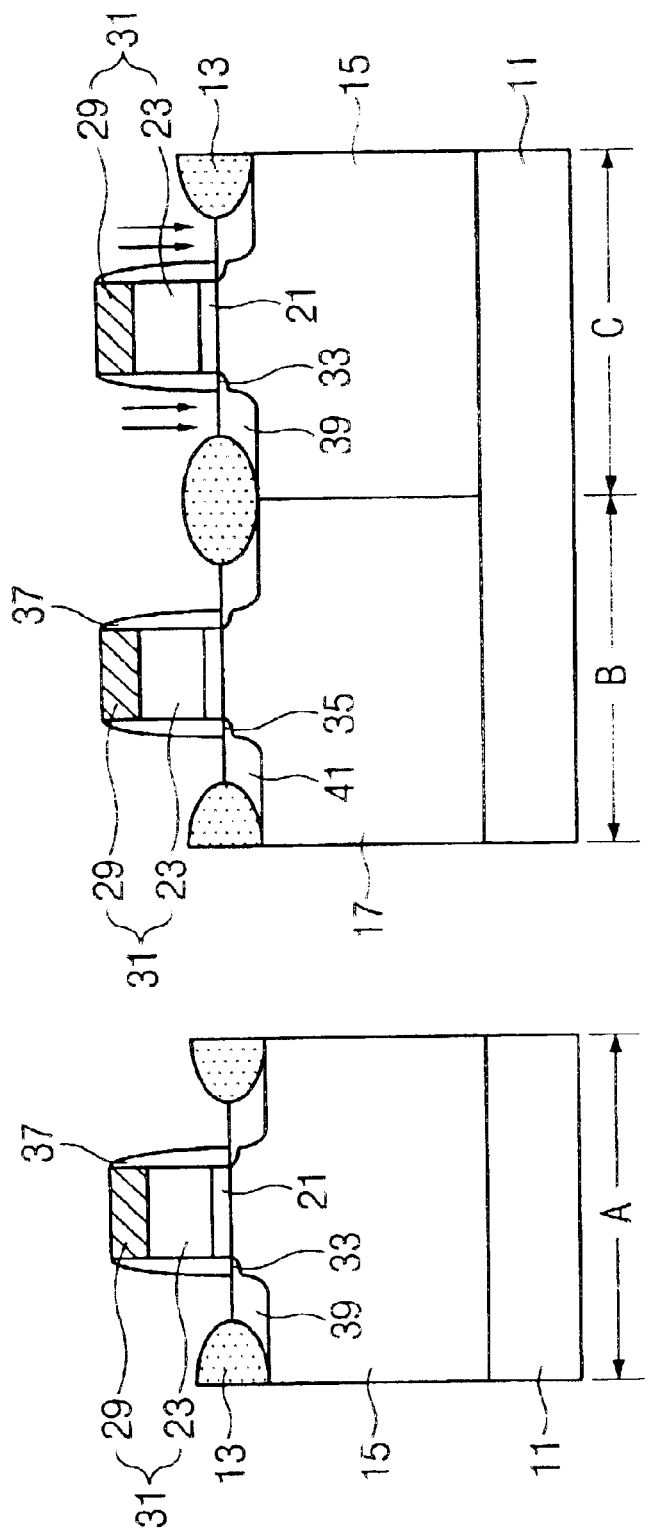

CM OS OF SEMICONDUCTOR DEVICE AND METHOD FOR MANUFACTURING THE SAME

BACKGROUND OF THE INVENTION

1. Field of the Invention

The present invention relates to a complementary metal oxide semiconductor (hereinafter, a CMOS field effect transistor) of a semiconductor device and a method for manufacturing the same and, more particularly, a method for manufacturing the same having improved characteristics, yield and reliability by performing a decoupled plasma nitridation (DPN) process on a gate oxide film of NMOS structures in the cell region and PMOS structures in the peripheral circuit region to form a silicon nitride on the surface of the gate oxide film.

2. Description of the Related Art

Generally, a CMOS device includes PMOS transistors with low power consumption and NMOS transistors capable of high-speed operation formed symmetrically. Although it has a low degree of integration and a complicated manufacturing process, CMOS devices are generally characterized by low power consumption.

FIG. 1 is a plan view illustrating a cell region and a peripheral circuit region of a semiconductor device.

Referring to FIG. 1, in the CMOS device, the threshold voltage of the NMOS in the cell region 100 should be approximately +1V to reduce the off current during operation of the device, and the threshold voltage of the PMOS and NMOS in the peripheral circuit region 200 should be higher than −0.5V and lower than +0.5V, to increase the operating speed. A separate mask and excessive ion implantation is required to achieve this result, which complicates the manufacturing process.

The CMOS gate electrode is typically formed of a polysilicon layer having a high melting point as a result of the ease of deposition of the thin film and line pattern, stability against oxidation atmosphere and ease of planarization.

The conventional gate electrode employs n+ polysilicon for both NMOS and PMOS regions. However, a buried channel is formed due to counter doping in the PMOS region, which results in short channel effects and an increase in leakage current.

In an attempt to overcome these disadvantages, a dual gate electrode, which employs n+ polysilicon as a gate electrode in the NMOS region, and p+ polysilicon in the PMOS region, is used to form a surface channel on both NMOS and PMOS regions.

FIG. 2A through 2E are cross sectional views illustrating a method for manufacturing the conventional CMOS, wherein "A" indicates a region on which a cell region NMOS is to be formed, "B" indicates a region on which a peripheral circuit region PMOS is to be formed, and "C" indicates a region on which a peripheral circuit region NMOS is to be formed.

Referring to FIG. 2A, a field oxide 13 defining an active region is formed on a semiconductor substrate 11.

Then, using an ion implantation mask, p-type and n-type impurities are selectively injected into the semiconductor substrate 11, and a drive-in process is performed to form p-well 15 and n-well 17.

Referring to FIG. 2B, a first oxide film 19 is grown on the semiconductor substrate 11 by a thermal oxidation process, and impurity ions for adjusting the threshold voltage are implanted to the resulting structure. Here, the first oxide film 19 prevents generation of surface defects in the semiconductor substrate 11 during the ion implantation of the impurity ions necessary to adjust the threshold voltage.

Referring to FIG. 2C, the first oxide film 19 is removed, and a second oxide film 21 and an undoped polysilicon layer 23 are formed on the resulting structure.

Subsequently, the polysilicon layer 23 on the p-well 15 is doped with n-type impurities such as phosphorous (P) or arsenic (As) ions by performing an ion implantation using an n-well mask (not shown).

Next, the polysilicon layer 23 on the n-well 17 is doped with p-type impurities such as boron (B) or $BF_2$ ions by performing an ion implantation using a p-well mask.

Referring to FIG. 2D, a metal layer 29 is formed on the polysilicon layer 23.

The metal layer 29, the polysilicon layer 23 and the second oxide film 21 are selectively etched by performing a photolithography process using a gate electrode mask, thereby forming a gate oxide of the second oxide film 21 and a gate electrode 31 on the upper side of the p-well 15 and the n-well 17, respectively. Here, the gate electrode 31 comprises a stacked structure of the polysilicon layer 23 and the metal layer 29.

Referring to FIG. 2E, a low con cent ration n-type impurity region 33 is formed in the p-well 15 on both side of the gate electrode 31 by preforming an ion implantation of n-type impurity ions using the n-well mask (not shown) followed by a drive-in process.

Thereafter a low concentration p-type impurity region 35 is formed in the n-well 17 on both sides of the gate electrode 31 by performing an ion implantation of a low concentration of p-type impurity ions using the p-well mask (not shown) followed by a drive-in process.

Then a nitride spacer 37 is formed on a sidewall of the gate electrode 31.

Subsequently, a high concentration n-type impurity region 39 is formed in the p-well 15 on both sides of the gate electrode 31 including the nitride spacer 37 by performing an ion implantation of a high concentration of n-type impurity ions using the n-well mask (not shown) followed by a drive-in process.

Thereafter, a high concentration p-type impurity region 41 is formed in the n-well 17 on both sides of the gate electrode 31 including the nitride spacer 37 by performing an ion implantation with a high concentration p-type impurity ions using the n-well mask (not shown) and the drive-in process.

As described above, since the conventional CMOS device and its manufacturing method involves the formation of the dual polysilicon gate electrode, the device characteristics of the conventional CMOS device are degraded by the following effects.

First, when boron in the gate oxide film region of a $p^+$ polysilicon gate electrode in the PMOS region is not activated, a gate depletion effect of the gate electrode is generated at the CMOS polysilicon gate electrode, decreasing reverse capacitance and increasing threshold voltage.

Second, the phenomenon of the remaining boron ions in the $p^+$ polysilicon gate electrode penetrating the gate oxide film to diffuse into the channel region of the semiconductor substrate, i.e., boron penetration phenomenon occurs. As a result, the flat band voltage and the threshold voltage are varied, and the gate oxide integrity (GOI) characteristics deteriorate.

SUMMARY OF THE INVENTION

It is, therefore, an object of the present invention to provide a CMOS device and a method for manufacturing the same, wherein a single gate CMOS with a surface channel is formed by performing a DPN (Decoupled Plasma Nitridation) process on a gate oxide film of a cell region NMOS and a peripheral circuit region PMOS, and forming a silicon nitride film on the surface of the gate oxide film, thereby more easily forming a single gate CMOS with a surface channel without the need for any excessive ion implantation process even when a gate electrode of n+ polysilicon layer is used, which is possible by having the threshold voltage of the cell region NMOS at approximately +0.9V, the threshold voltage of the peripheral circuit region PMOS at approximately −0.5V and below, and lastly, the threshold voltage of the peripheral circuit region NMOS at approximately +0.5V and below.

To achieve the above object, there is provided a CMOS of a semiconductor device that includes: a semiconductor substrate including an n-well and p-well in a peripheral circuit region, and a p-well in a cell region; a gate oxide film a disposed on the semiconductor substrate of the n-well in the peripheral circuit region and the p-well in the cell region, the gate oxide film having a surface nitridized by decoupled plasma nitridation process; and a gate electrode formed on the gate oxide film.

Another aspect of the present invention provides a method for manufacturing the CMOS of the semiconductor device, which includes the steps of: forming a gate oxide film on a semiconductor substrate including an n-well and a p-well in a peripheral circuit region, and a p-well in a cell region; performing a decoupled plasma nitridation process to nitridize a surface of the gate oxide film on the n-well of the peripheral circuit region and the p-well of the cell region; and forming a gate electrode on the gate oxide film.

The principle of the present invention lies in the fact that the gate oxide film of the cell region NMOS and the peripheral circuit region PMOS goes through the DPN (Decoupled Plasma Nitridation) process to form a silicon nitride on the surface of the gate oxide film, thereby forming a single gate CMOS with a surface channel. Therefore, even when a gate electrode of n⁺polysilicon layer is used, it is possible to have a threshold voltage of the cell region NMOS at approximately +0.9V, the threshold voltage of the peripheral circuit region PMOS at approximately −0.5V and below, and lastly, the threshold voltage of the peripheral circuit region NMOS at approximately +0.5V and below, without a separate transient ion implantation process.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore not to be considered limiting of its scope, the invention will be described with additional specificity and detail through use of the accompanying drawings in which:

FIGS. 2A through 2E are cross sectional views showing a method for manufacturing a conventional CMOS of a device;

DETAILED DESCRIPTION OF THE PREFERRED EMBODIMENT

Figure 1:
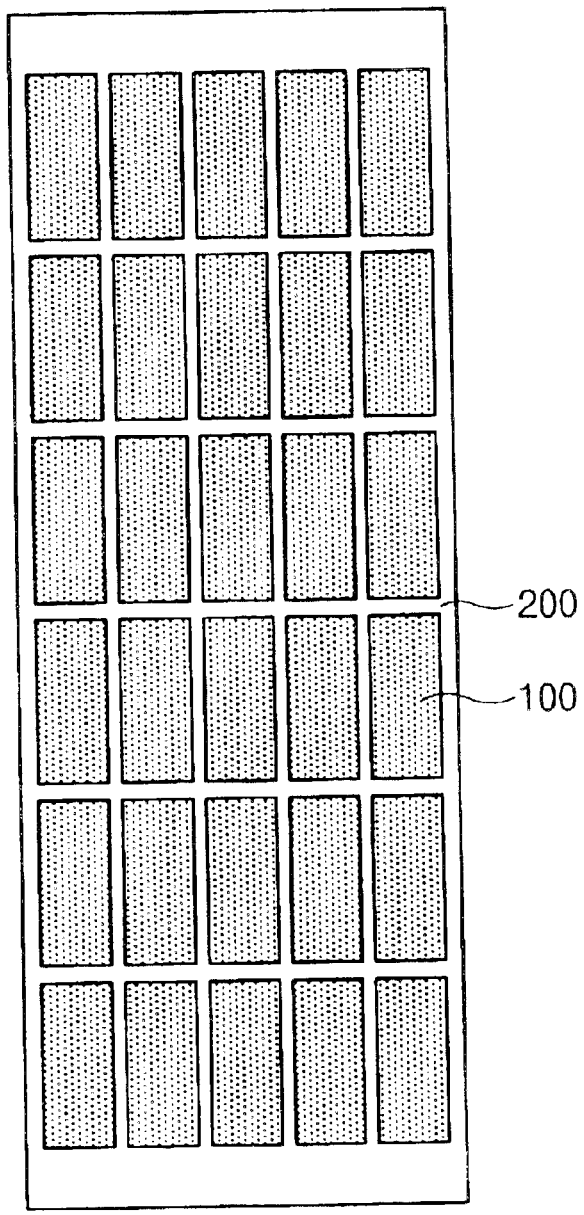
FIG. 1 is a plan view showing a cell region and a peripheral circuit region.
Figure 2A:
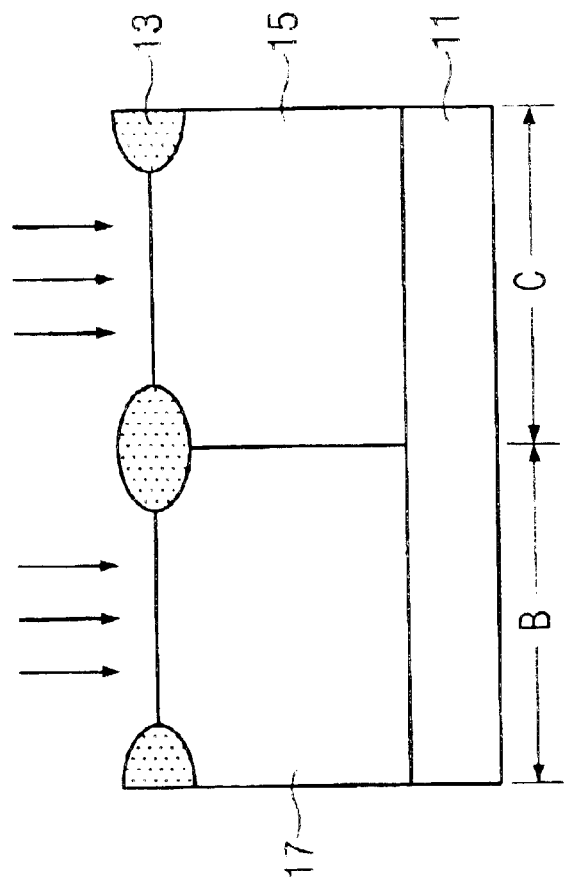
Figure 2B:
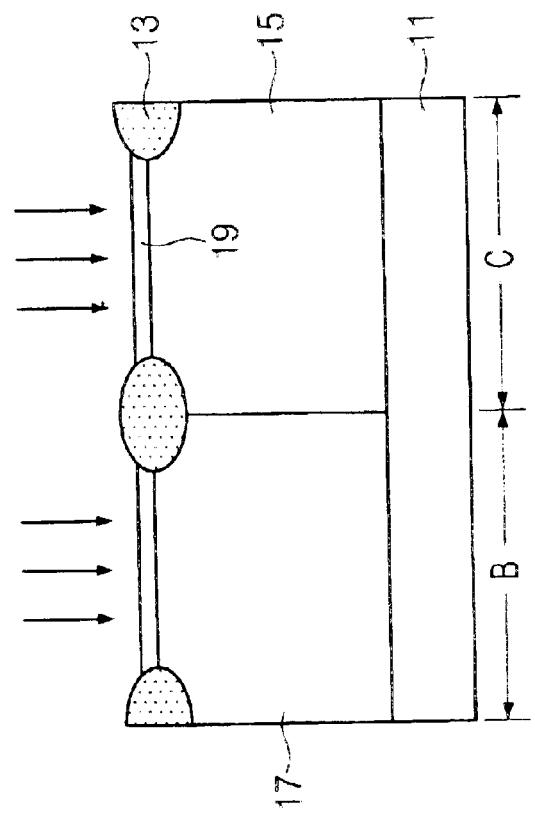
Figure 2B:
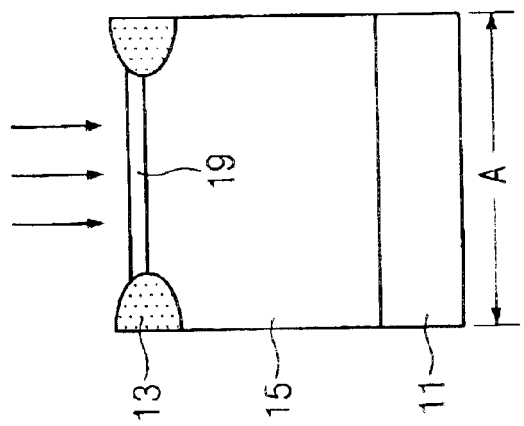
Figure 2C:
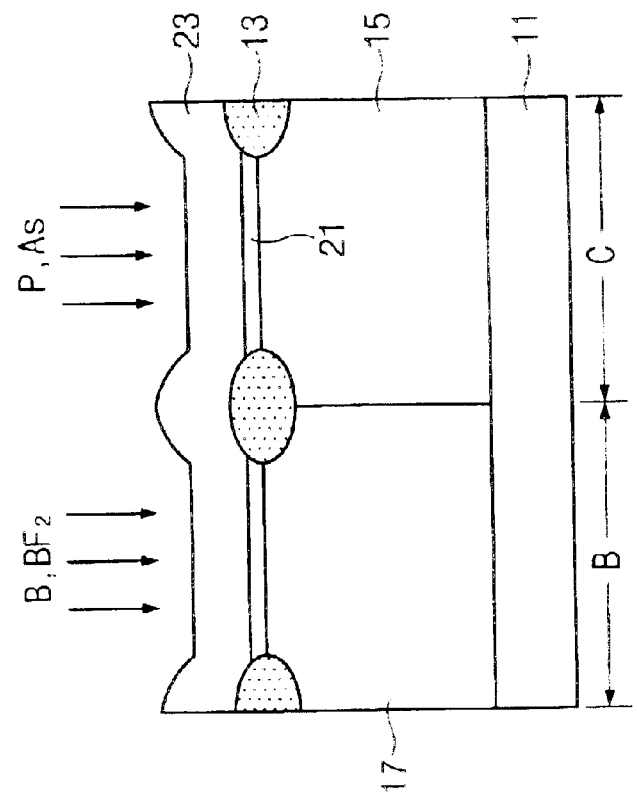
Figure 2D:
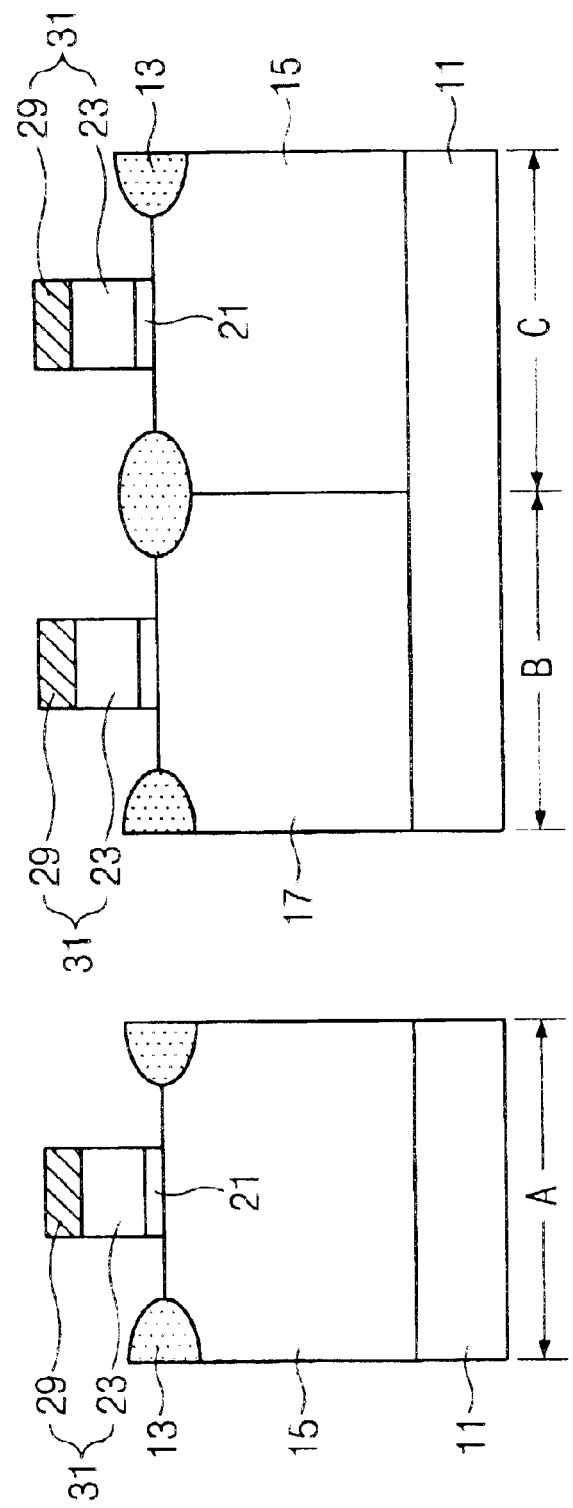

A preferred embodiment of the present invention will now be described with reference to the accompanying drawings. In the following description, the same drawing reference numerals are used for the same elements in different drawings. The particular structures defined in the description, such as a detailed construction and elements of a circuit are provided merely to assist in providing a comprehensive understanding of the invention. Thus, it will be apparent to those of ordinary skill in the art that the present invention can be carried out with different structures. Also, well-known functions or constructions are not described in detail since they would obscure the invention in unnecessary detail.

FIGS. 3A through 3E are cross sectional view illustrating a method for manufacturing a CMOS device in accordance with a first embodiment of the present invention. Here, "A" indicates a region on which a cell NMOS is to be formed, "B" indicates a region on which a peripheral circuit region PMOS is to be formed, and "C" indicates a region on which a peripheral circuit region NMOS is to be formed.

Figure 3A:
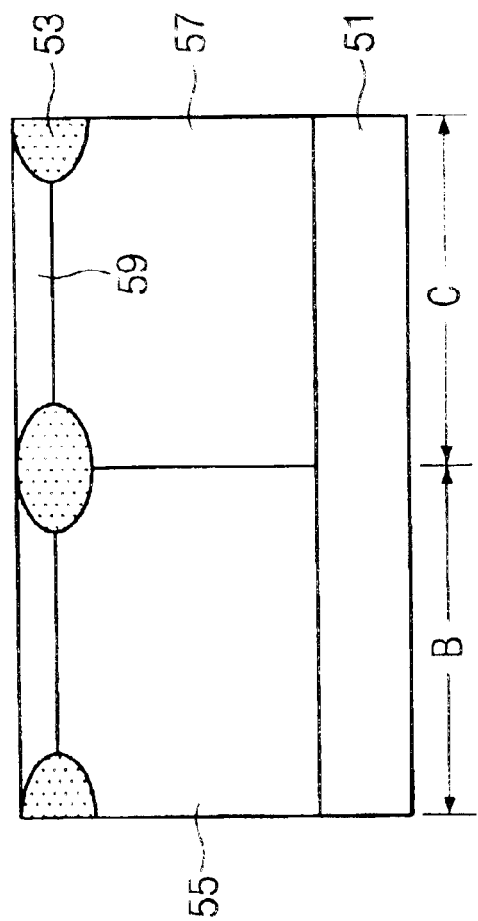
FIGS. 3A through 3E are cross sectional views showing a method for manufacturing a CMOS of a device in accordance with a first embodiment of the present invention.

Referring to FIG. 3A, a device isolation film 53 defining an active region is formed on a semiconductor substrate 51.

Thereafter, p-type or n-type impurities are selectively ion implanted into the semiconductor substrate 51 using an ion implantation mask, and a drive-in process is performed to form a p-well 55 and an u-well 57.

Next, a first oxide film 59, which is a gate oxide film, is grown to a thickness ranging from 5 to 100 Å by thermally oxidizing the semiconductor substrate 51. A high dielectric film which is not reactive with polysilicon such as $Al_2O_3$, $HfO_2$, $Hf.SiO_2$, or $Zr.SiO_2$ film can also be used instead of a thermal oxide film.

Figure 3B:
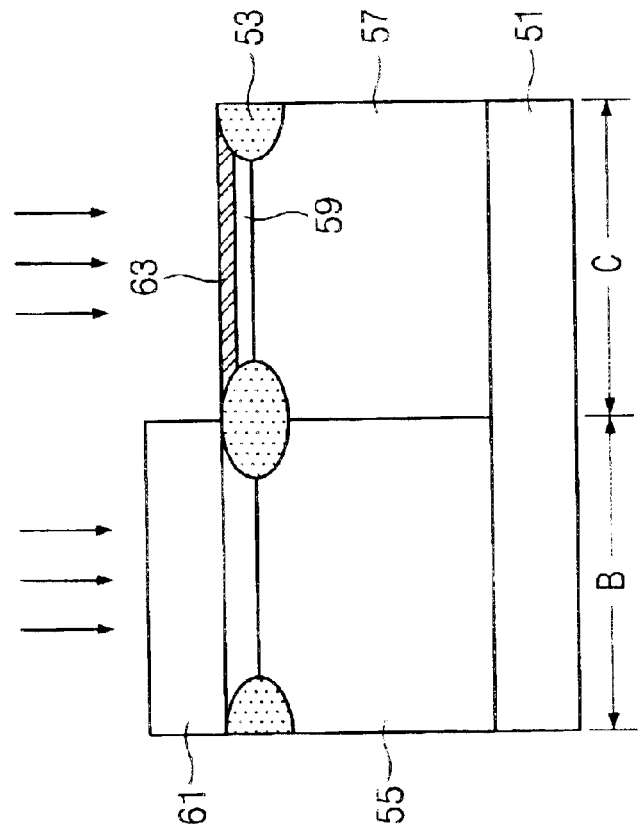

Referring to FIG. 3B, a first photoresist film is coated on the first oxide film 59. The first photoresist film is then exposed and developed to form a first photoresist pattern 61 that covers the region B where the peripheral circuit region NMOS is to be formed.

Thereafter, the DPN process is performed, using the first photoresist film pattern 61 as a mask, to nitridize the surface of the gate oxide fun 59 in the region A where the cell region NMOS is to be formed, and the region C where the peripheral circuit region PMOS is to be formed, thereby forming a silicon nitride 63.

Here, the DPN process is performed at a temperature ranging from 0 to 400° C., a chamber vacuum level ranging from 5 to 20 mT, a RF plasma power ranging from 100~ to 700 W, and under a nitrogen atmosphere with a flow of ranging from 10~ to 500 sccm of nitrogen for 50~ to 100 seconds.

In addition, a gas selected from a group consisting of NH3, N2O, $NF_3$ and NO, or a combination thereof can be used instead of using the nitrogen gas ($N_2$) for the DPN process.

After the DPN process of the gate oxide film 59, a thermal process is performed at a temperature of ranging from 100~ to 800° C. for 1 to 30 minutes in an atmosphere containing of $N_2$, Ar or vacuum or combinations thereof.

Figure 3C:
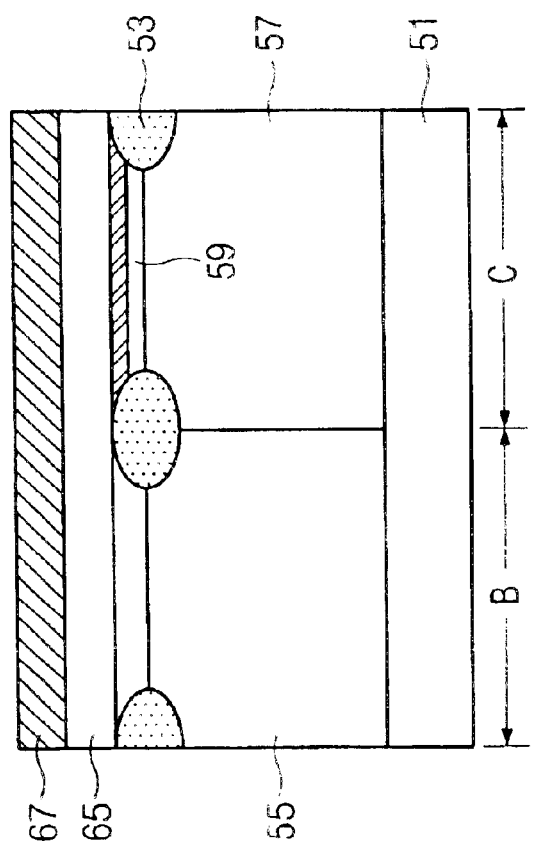

Referring to FIG. 3C, the first photoresist film pattern 61 is removed, and a polysilicon layer 65 and a metal conductive layer 67, are formed on resulting structure including the gate oxide film 59 at a thickness of ranging from 100 to 1000 Å, respectively. Here, the polysilicon layer 65 is formed of a polysilicon layer doped with n-type impurities having a work function ranging from 4.1 to 4.3 eV. In addition, the conductive layer 67 is fanned of a W/WN layer to decrease the gate resistance. A suicide may be formed instead of the conductive layer 67.

Figure 3D:
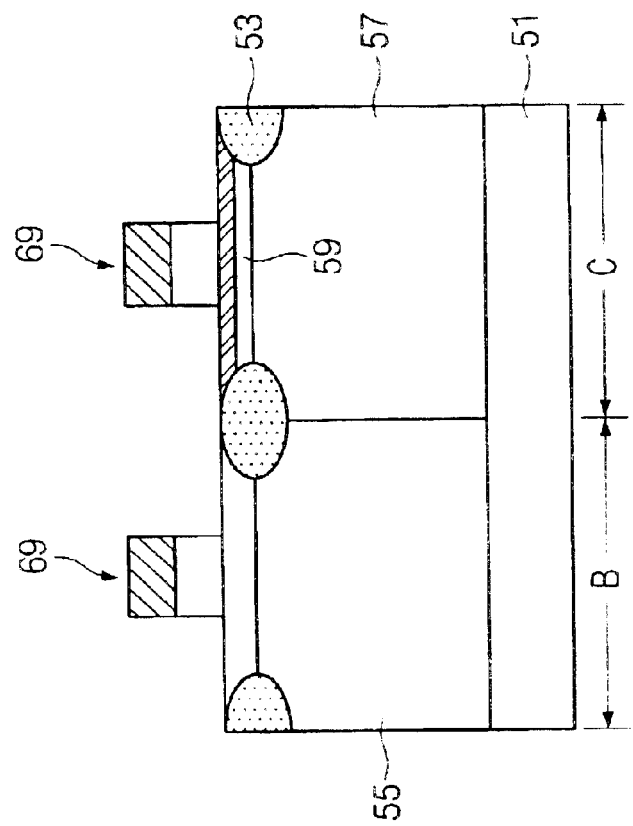

Referring to FIG. 3D, the conductive layer 67 and the polysilicon layer 65 are etched by performing a photolithography process using a gate electrode mask. Here, a gate electrode 69 comprising a stacked structure of the polysilicon layer 65 and the conductive layer 67 is formed on the semiconductor substrate 51 in the region A where the cell region NMOS is to be formed, of the region B where the peripheral circuit region NMOS is to be formed, and of the region C where the peripheral circuit region PMOS is to be formed, respectively.

Figure 3E:
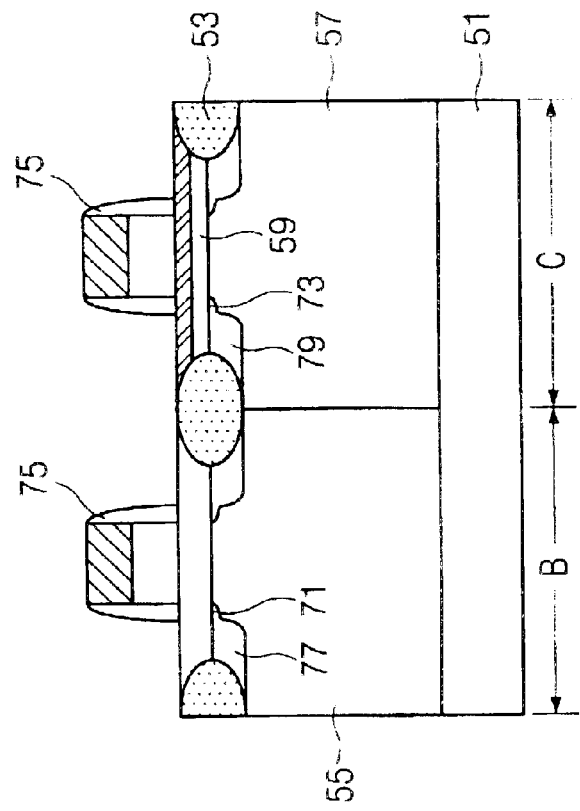

Referring to FIG. 3E, a low concentration n-type impurity region 71 is formed on the surface of the p-well 55 at both sides of the gate electrode 69 in the region A where the cell region NMOS is to be formed, and in the region B where the peripheral circuit region NMOS is to be formed, by ion-implanting low concentration n-type impurities, Similarly, a low concentration p-type impurity region 73 is formed on the surface of the n-well 57 at both sides of the gate electrode 69 in the region C where the peripheral circuit region PMOS is to be formed, by ion-implanting low concentration p-type impurities.

Then, a silicon nitride spacer 75 is formed on the sidewall of the gate electrode 69.

Next, a high concentration n-type impurity region 77 is formed on the surface of the p-well 55 at both sides of the silicon nitride spacer 75 in the region where the cell region NMOS is to be formed, and the region B where the peripheral circuit region NMOS is to be formed, by ion-implanting high concentration n-type impurities, thereby forming an n-type source/drain impurity region having an LDD a lightly doped drain structure.

Thereafter, a high concentration impurity region 79 is formed on the surface of the n-well 57 at both sides of the silicon nitride spacer 75 in the region C where the peripheral circuit region PMOS is to be formed by ion-implanting high concentration p-type impurities, thereby forming a p-type source/drain impurity region having an LDD structure.

FIGS. 4A through 4E are cross sectional views illustrating a method for manufacturing a CMOS of a semiconductor in accordance with a second embodiment of the present invention. Here, "A" indicates a region on which the cell region NMOS is to be formed, "B" indicates a region on which the peripheral circuit region PMOS is to be formed, and "C" indicates a region on which the peripheral circuit region NMOS is to be formed.

Figure 4A:
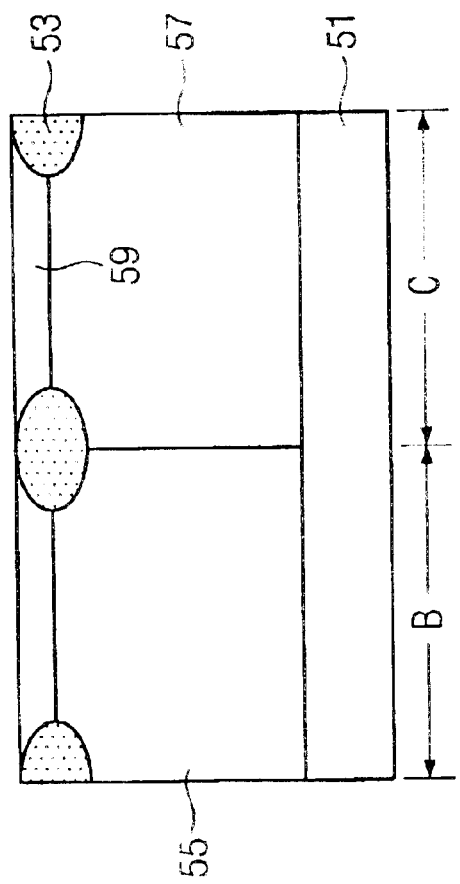
FIGS. 4A through 4E are cross sectional views showing a method for manufacturing a CMOS of a device in accordance with a second embodiment of the present invention.
Figure 4A:
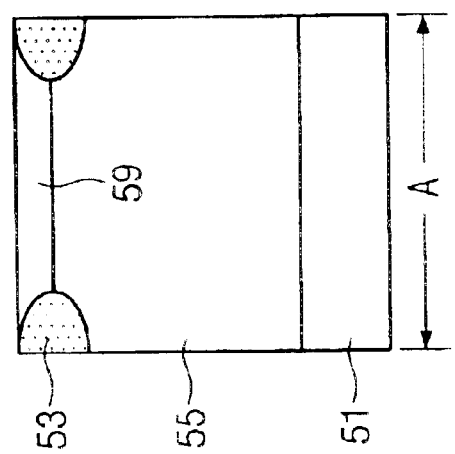

Refering to FIG. 4A, the device isolation film 53 defining an active region is formed on the semiconductor substrate 51.

Thereafter, p-type or n-type impurities are selectively ion-implanted into the semiconductor substrate 51 using an ion implantation mask, and a drive-in process is performed to form the p-well 55 and the n-well 57.

Next, a first oxide film 59, which is gate oxide thin, is grown to a thickness ranging from 5 to 100 Å by thermally oxidizing the semiconductor substrate 51. Here, a first oxide film 59, a high dielectric film that is not reactive with polysilicon such as $Al_2O_3$, $HfO_2$, $Hf.SiO_2$, or $Zr.SiO_2$ film can also be used instead of a thermal oxide film.

Figure 4B:
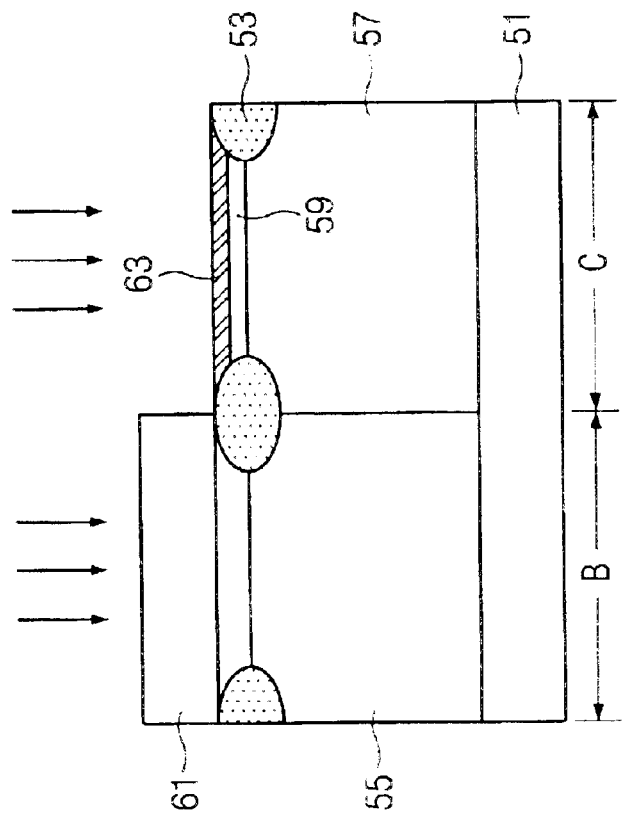
Figure 4B:
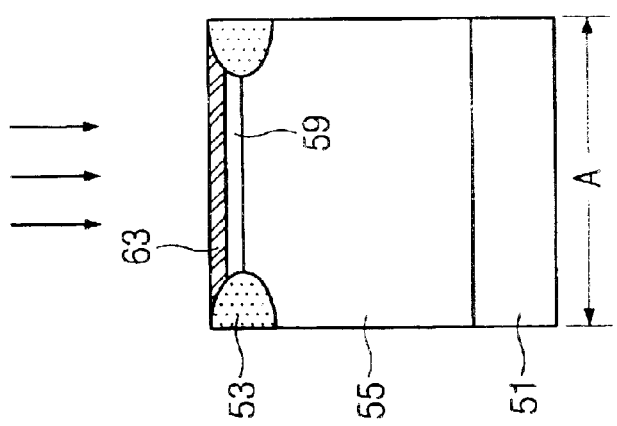

Referring to FIG. 4B, the first photoresist film is coated on the gate oxide film 59, and the first photoresist film is exposed and developed to form a first photoresist film which covers the region C only, where the peripheral circuit region NMOS is to be formed.

Thereafter, the DPN process is performed, using the first photoresist film pattern 61 as a mask, to nitridize the surface of the gate oxide film 59 in the region A where the cell region NMOS is to be formed, and the region C where the peripheral circuit region PMOS is to be formed, thereby forming a silicon nitride 63.

Here, the DPN process is performed at a temperature ranging from 0 to 400° C., a chamber vacuum level ranging from 5 to 20 mT, a RF plasma power ranging from 100~ to 700 W, and under nitrogen atmosphere with a flow ranging from 10~ to 500 sccm of nitrogen for 50~ to 100 seconds.

In addition, a nitrogen-containing gas selected from a group consisting of $NH_3$, $N_2O$, $NF_3$ and NO, or a combination thereof can be used instead of the nitrogen gas for the DPN process.

After the DPN process of the gate oxide film 59, a thermal process is performed at a temperature ranging from 100~ to 800° C. for 1 to 30 minutes in an atmosphere of $N_2$, Ar or a combination or under a vacuum.

Figure 4C:
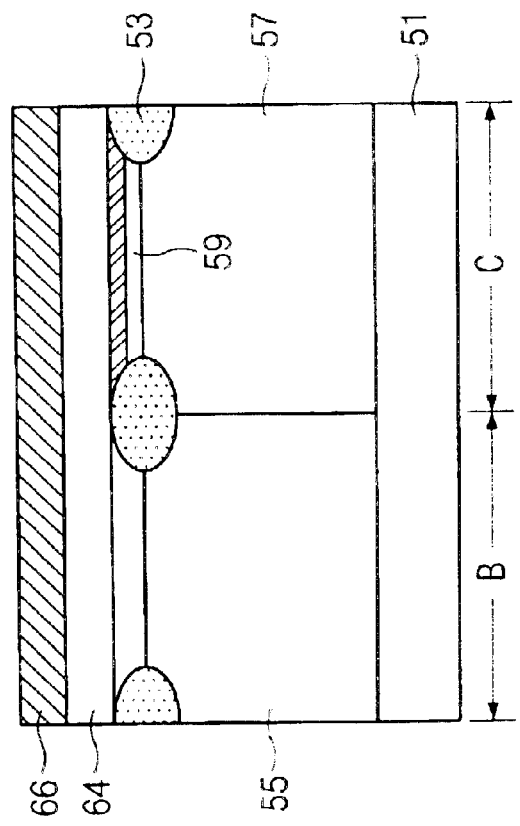
Figure 4C:
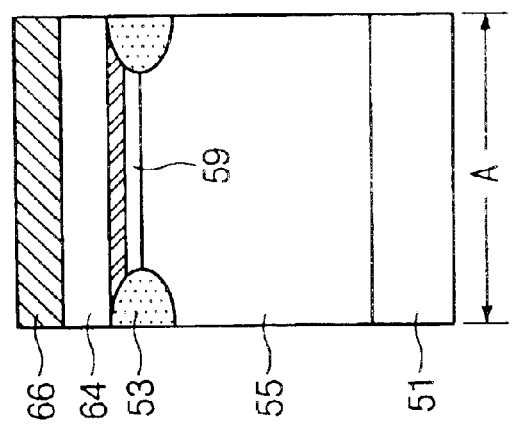

Referring to FIG. 4C the first photoresist film pattern 61 is removed, and a first conductive layer 64 and a second conductive layer 66 are formed on the resulting structure including the gate oxide film 59 at a thickness ranging from 100 to 1000 Å, respectively.

Here, the first conductive layer 64 is formed of a second conductive layer such as $TaN_x$, $TaSi_xN_y$, or Ta layers having a work function of ranging from 4.1 to 4.3 eV, In addition, the second conductive layer 66 is formed of a W/WN layer to decrease the gate resistance. A suicide may be formed instead of the second conductive layer 67.

Figure 4D:
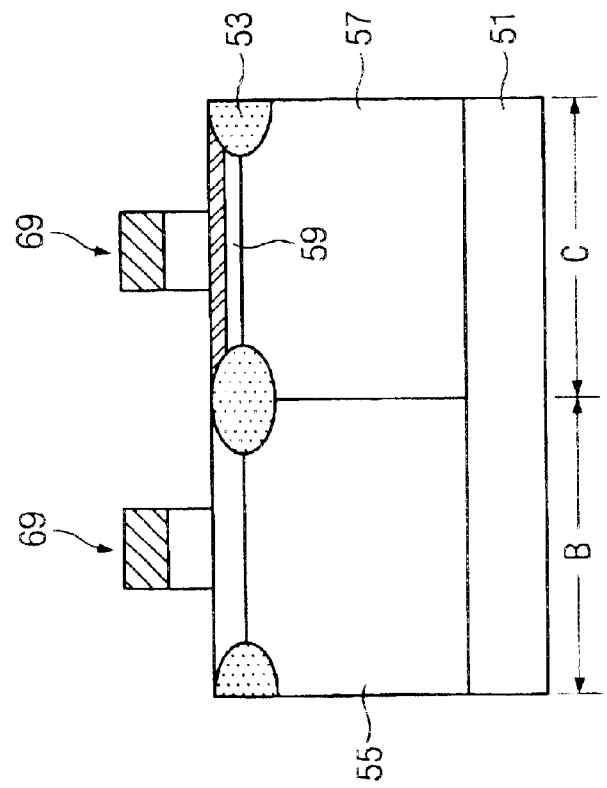
Figure 4D:
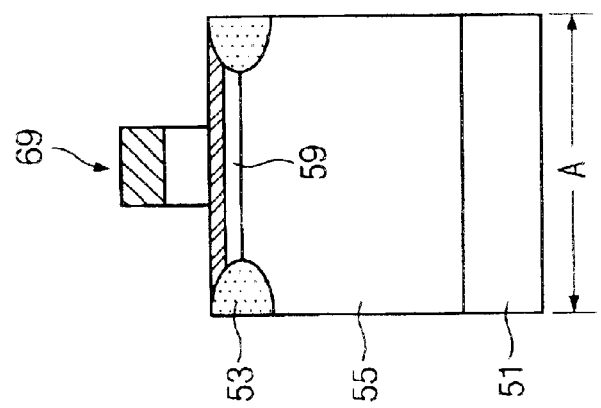

Referring to FIG. 4D, the second conductive layer 67 and the first conductive layer 65 are etched by performing a photolithography process using a gate electrode mask. Here, a gate electrode 69 comprising a stacked structure of the first conductive layer 65 and the second conductive layer 67 is formed on the semiconductor substrate 51 in the region A where the cell region NMOS is to be formed, of the region B where the peripheral circuit region NMOS is to be formed, and of the region C where the peripheral circuit region PMOS is to be formed, respectively.

Figure 4E:
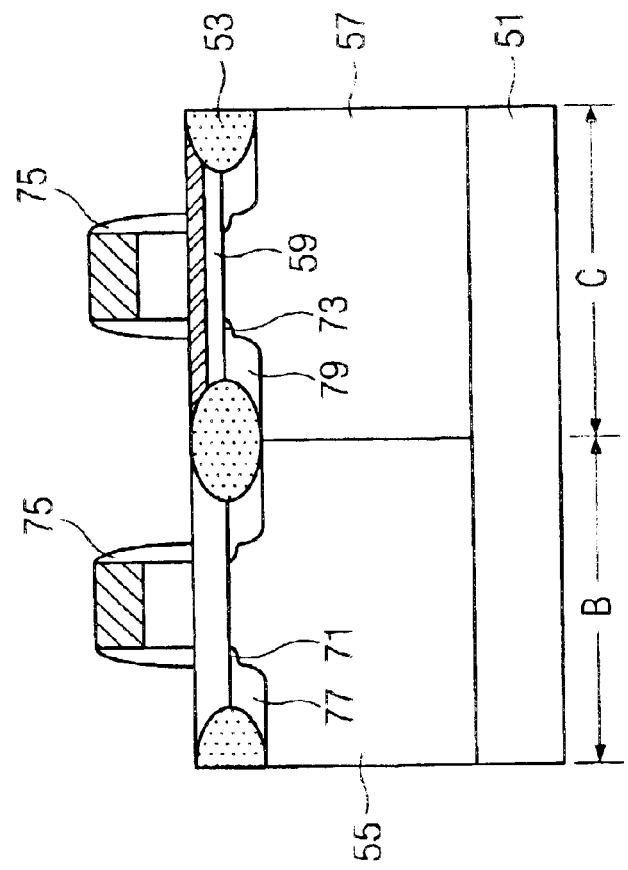

Referring to FIG. 4E, a low concentration n-type impurity region 71 is formed on the surface of the p-well 55 at both sides of the gate electrode 69 in the region A where the cell region NMOS is to be formed, and in the region B where the peripheral circuit region NMOS is to be formed, by ion-implanting low concentration n-type impurities.

Similarly, a low concentration p-type impurity region 73 is formed on the surface of the n-well 57 at both sides of the gate electrode 69 in the region C where the peripheral circuit region PMOS is to be formed by ion-implanting low concentration p-type impurities.

Then, by forming a silicon nitride on the front side including the gate electrode 69 and by etching the subject film, a silicon nitride spacer 75 is formed on the sidewall of the gate electrode 69.

Next, a high concentration n-type impurity region 77 is formed on the surface of the p-well 55 at both sides of the silicon nitride spacer 75 in the region A where the cell region NMOS is to be formed, and the region B where the peripheral circuit region NMOS is to be formed by implanting high concentration n-type impurities, thereby forming an n-type source/drain impurity region having an LDD structure.

Thereafter, a high concentration impurity region 79 is formed on the surface of the n-well 57 at both sides of the silicon nitride spacer 75 in the region C where the peripheral circuit region PMOS is to be formed by implanting a high concentration p-type impurity ions, thereby forming a p-type source/drain impurity region having an LDD structure.

Figure 5:
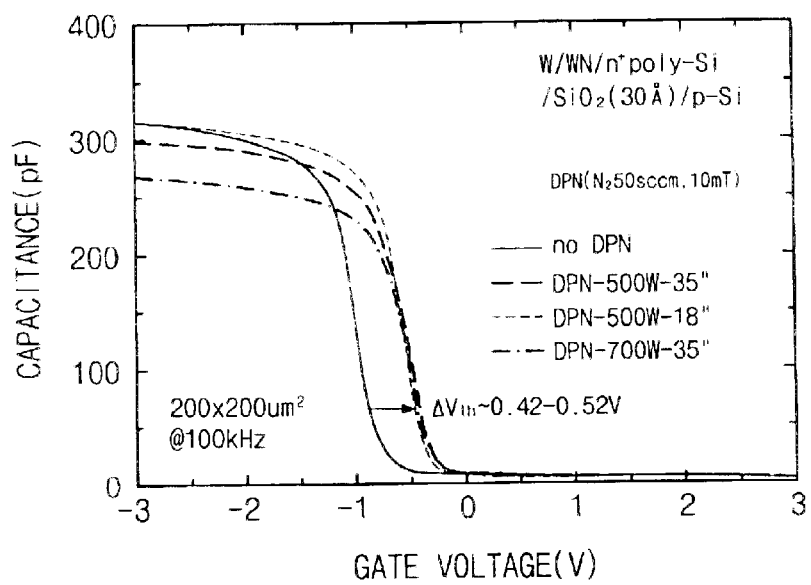
FIG. 5 is a diagram illustrating a capacitance-voltage (C-V) curve of a MOS after a decoupled plasma nitridation (DPN) process is performed on a gate oxide film.
Figure 6:
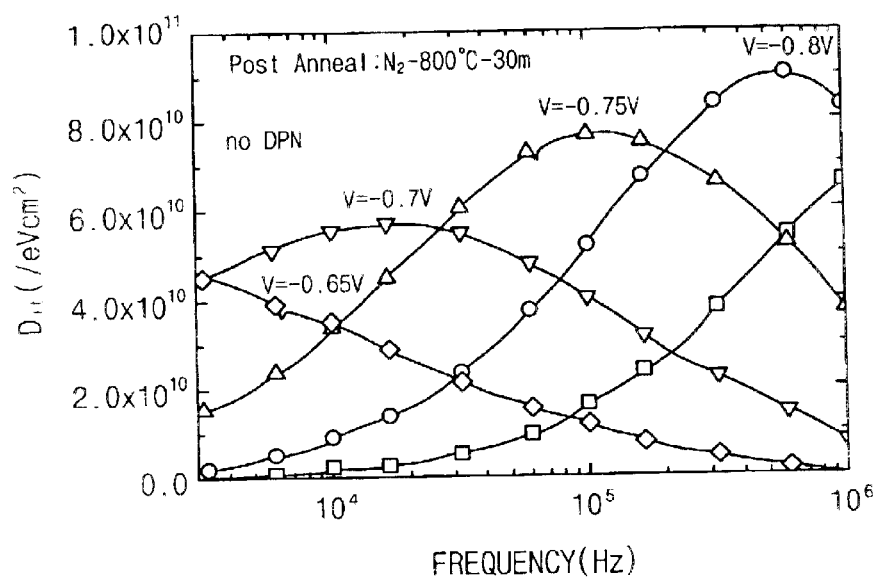
FIG. 6 a diagram illustrating Dit (Interface trap density) characteristics of a gate oxide film without the DPN process.

FIG. 5 is a diagram illustrating a capacitance-voltage (C-V) curve of a MOS with and without a decoupled plasma nitridation (DPN) treatment of a gate oxide film. FIG. 6 is a diagram illustrating Dit (Interface trap density) characteristics of an NMOS having a gate oxide film without a DPN treatment, and FIG. 7 is a diagram illustrating Dit (Interface trap density) characteristics of an NMOS having a gate oxide film with a DPN treatment.

Referring to FIG. 5, the threshold voltage of the NMOS having the DPN treated gate oxide film is higher than that of the NMOS having the gate oxide film without the DPN treatment by +0.4V to +0.5V.

Figure 7:
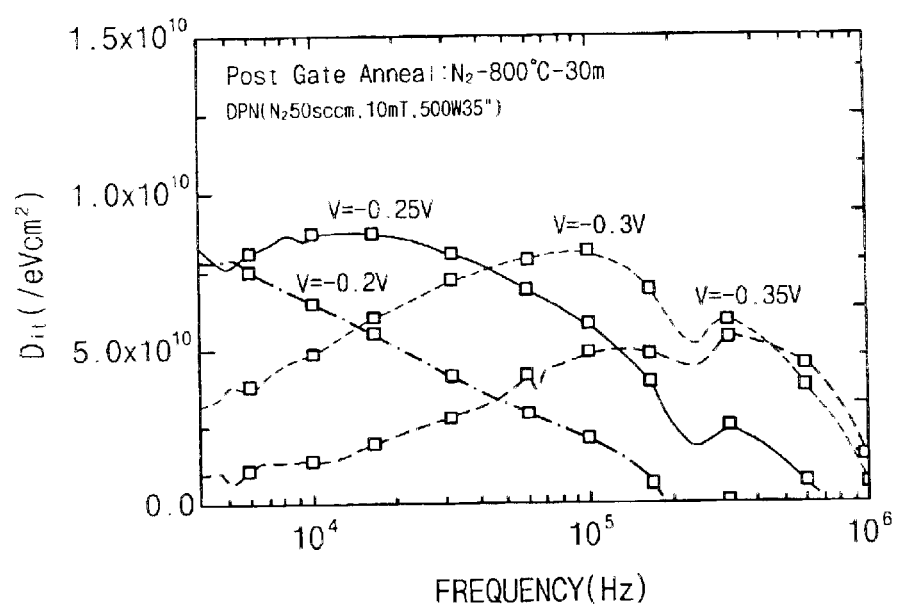
FIG. 7 is a diagram illustrating $D_{it}$ (Interface trap density) characteristics of a gate oxide film treated with the DPN process.

As depicted in FIGS. 6 and 7, the $D_{it}$ characteristics of the NMOS having a gate oxide film treated by the DPN, ($1\times10^{11}$/eV-cm$^2$), are superior to the $D_{it}$ (Interface trap density) characteristics of the NMOS having a gate oxide film without the DPN process, ($1\times10^{10}$/eV-cm$_2$).

The single gate CMOS having a surface channel comprising a nitride on the surface of the gate oxide film formed by performing DPN process on the gate oxide film of the cell region NMOS and the peripheral circuit region PMOS has advantages of low driving voltage, improved characteristics, yield and reliability of the device, due to the following reasons.

First, in case of using the gate electrode comprising the n$^+$ polysilicon layer, the CMOS having a surface channel can be formed without a excessive ion implantation process, with the threshold voltage of +0.9V for the cell region NMOS, the threshold voltage of −0.5V and above for the peripheral circuit region PMOS, and the threshold voltage of +0.5V and below for the peripheral circuit region NMOS.

Second, since the cell region NMOS has the threshold voltage of +0.9V due to DPN treatment of the gate oxide film, a separate back bias for the threshold voltage of +0.9V is not required, thereby achieving lower power consumption.

Third, since a separate ion implantation process for adjusting the threshold voltage is not required during the formation of the cell region NMOS, the process is simplified.

Finally, since the doping process is not employed during the formation of the gate electrode, depletion effect of the gate electrode or boron penetration phenomenon observed in the conventional dual polysilicon gate electrode is prevented.

While the teaching of the invention have been explained with respect to particular examples, it will be apparent to those of ordinary skill in the art that the scope of this patent is not limited to those examples. On the contrary, this patent covers all apparatuses and methods filling within the spirit and scope of the appended claims, either literally or under the doctrine of equivalents.

What is claimed is:

1. A method for manufacturing a CMOS device, the method comprising the steps of:

forming a gate oxide film on a semiconductor substrate including an n-well and a p-well in a peripheral circuit region, and a p-well in a cell region;

performing a decoupled plasma nitridation process to nitridize a surface of the gate oxide film on the n-well of the peripheral circuit region and the p-well of the cell region; and forming a gate electrode on the gate oxide film.

2. The method of claim 1, wherein the gate oxide film has thickness ranging from 5 to 100 Å.

3. The method of claim 1, wherein the decoupled plasma nitridation process is performed at a temperature ranging from 0 to 400° C., a chamber vacuum level ranging from 5 to 20 mT and a RF plasma power ranging from 100 to 700 W for 50 to 100 seconds, and performing a thermal process.

4. The method of claim 3, wherein the decoupled plasma nitridation process employs at least one gas selected from the group consisting of $N_2$, $NH_3$, $N_2O$, $NF_3$ and NO at a flow rate ranging from 10 to 500 sccm.

5. The method of claim 3, wherein the thermal process is performed in a atmosphere of $N_2$, Ar, or a combination thereof or vacuum at a temperature ranging from 100 to 800° C. for 1 to 30 minutes.

6. The method of claim 1, wherein the gate oxide film comprises a high dielectric film.

7. The method of claim 6, wherein the high dielectric film comprises a material selected from a group consisting of $Al_2O_3$, $HfO_2$, $Hf.SiO_2$, and $Zr.SiO_2$.

8. The method of claim 1, wherein the gate electrode comprises a stacked structure of a polysilicon layer and a conductive layer.

9. The method of claim 8, wherein the polysilicon layer comprises a polysilicon layer doped with n-type impurities having a work function ranging from 4.1 to 4.3 eV.

10. The method of claim 8, wherein the conductive layer comprises a W/WN layer.

11. The method of claim 1, wherein the gate electrode comprises a stacked structure of a first conductive layer and a second conductive layer.

12. The method of claim 11, wherein the first conductive layer comprises a material selected from a group consisting of $TaN_x$, $TaS_xN_y$ and Ta having a work function ranging from 4.1 to 4.3 eV.

13. The method of claim 11, wherein the second conductive layer comprises a W/WN layer.

* * * * *